United States Patent
Tanaka

(10) Patent No.: US 10,710,169 B2
(45) Date of Patent: Jul. 14, 2020

(54) COATED CUTTING TOOL

(71) Applicant: TUNGALOY CORPORATION, Fukushima (JP)

(72) Inventor: Shigeki Tanaka, Iwaki (JP)

(73) Assignee: TUNGALOY CORPORATION, Iwaki-shi, Fukushima (JP)

(*) Notice: Subject to any disclaimer, the term of this patent is extended or adjusted under 35 U.S.C. 154(b) by 209 days.

(21) Appl. No.: 15/933,643

(22) Filed: Mar. 23, 2018

(65) Prior Publication Data
US 2018/0281079 A1 Oct. 4, 2018

(30) Foreign Application Priority Data

Mar. 28, 2017 (JP) .................. 2017-062038

(51) Int. Cl.
B23B 27/14 (2006.01)
C23C 14/32 (2006.01)
C23C 14/00 (2006.01)
C23C 14/06 (2006.01)
C23C 14/02 (2006.01)
C23C 28/00 (2006.01)
C23C 28/04 (2006.01)
B23C 5/24 (2006.01)
C23C 30/00 (2006.01)

(52) U.S. Cl.
CPC .............. B23B 27/148 (2013.01); B23C 5/24 (2013.01); C23C 14/0021 (2013.01); C23C 14/022 (2013.01); C23C 14/0611 (2013.01); C23C 14/0641 (2013.01); C23C 14/0647 (2013.01); C23C 14/0676 (2013.01); C23C 14/325 (2013.01); C23C 28/044 (2013.01); C23C 28/42 (2013.01); C23C 28/44 (2013.01); C23C 30/005 (2013.01); B23B 27/141 (2013.01); B23B 2251/14 (2013.01)

(58) Field of Classification Search
USPC .......... 51/307, 309; 428/216, 325, 336, 698, 428/699, 701, 702
See application file for complete search history.

(56) References Cited

U.S. PATENT DOCUMENTS

2012/0090247 A1* 4/2012 Miura ................. C23C 14/0036
51/309

FOREIGN PATENT DOCUMENTS

| JP | 2001-198709 | * | 7/2001 |
| JP | 2016-185589 A | | 10/2016 |
| KR | 20150043264 | * | 4/2015 |

* cited by examiner

Primary Examiner — Archene A Turner
(74) Attorney, Agent, or Firm — Studebaker & Brackett PC

(57) ABSTRACT

A coated cutting tool comprising a substrate and a coating layer formed on a surface of the substrate, the coating layer comprising a first laminate structure and a second laminate structure, wherein: the first laminate structure has a laminate structure in which predetermined compound layers of two kinds, each having a different composition, are laminated in an alternating manner; the first laminate structure satisfies a predetermined condition; the second laminate structure has a laminate structure in which a first compound layer comprising a predetermined oxide and/or oxynitride and a second compound layer having a predetermined composition are laminated in an alternating manner; and an average thickness of each compound layer which constitutes the first laminate structure, an average thickness of each compound layer which constitutes the second laminate structure, and a thickness of the coating layer in its entirety each fall within a predetermined range.

20 Claims, 1 Drawing Sheet

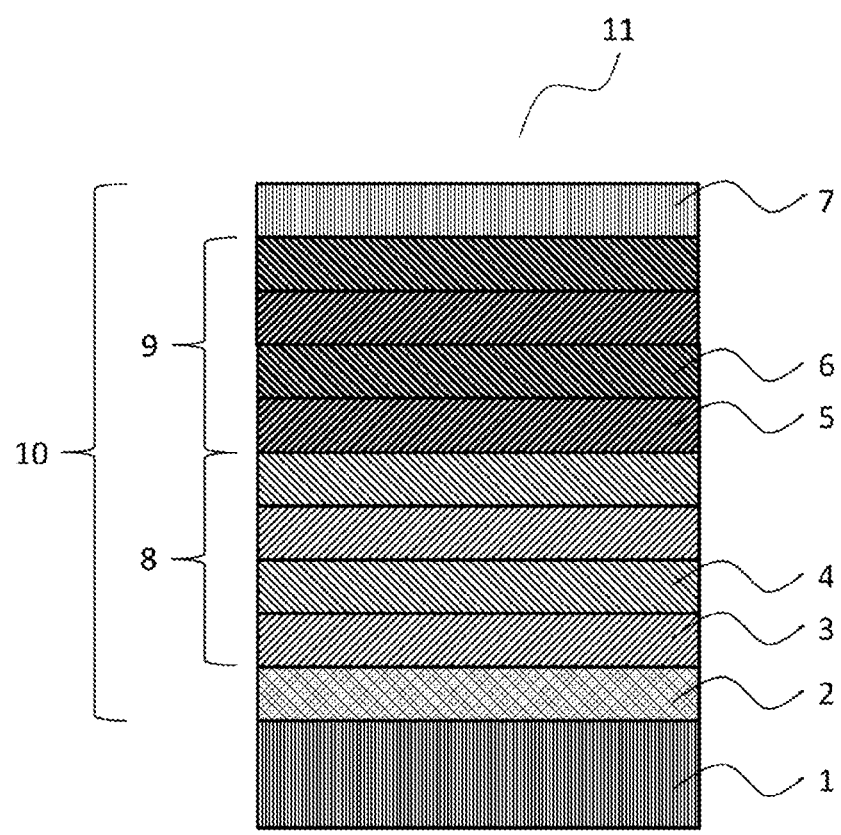

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with the improvement of highly efficient cutting. Thus, in terms of the performance required for tool materials, improvements of wear resistance and fracture resistance, which are directly related to the tool life, have been becoming increasingly important. In order to improve such characteristics, a coated cutting tool is used in which coatings are laminated in an alternating manner on a surface of a substrate.

Various techniques have been proposed in order to improve the characteristics of the above-described alternating laminate coatings. For example, JP2016-185589 A proposes a coated cutting tool in which: a base layer thereof consists of an alternating laminate of (Al, Ti)(O, N) layers and (Al, Ti)N layers; an intermediate layer thereof consists of an (Al, Ti)N layer; and an upper layer thereof consists of an alternating laminate of (Al, Cr)(O, N) layers and (Al, Mn)(O, N) layers.

SUMMARY

Technical Problem

There has been a trend in which cutting conditions are severe, compared with the prior art, in order to increase machining efficiency, and thus, a longer tool life than so far has been demanded. In particular, in the machining of difficult-to-machine materials, such as stainless cast steel and heat resisting steel, a cutting edge is at a high temperature due to the generation of heat during cutting. At this time, a reduction in the hardness of the coating tends to invite a reduction in the wear resistance. Further, the generation of thermal cracking on a cutting edge due to thermal factors tends to invite the occurrence of fractures in the tool. The above tendencies lead to the current situation where a tool reaches the end of its life in a relatively short period of time.

For example, in the invention of JP2016-185589 A, a situation may arise in which the wear resistance of the cutting tool cannot be sufficiently secured. In particular, under the conditions for high-speed machining on difficult-to-machine materials, a composite oxynitride layer can achieve an improvement of oxidation resistance; however, this may cause the problem of a reduction in the wear resistance.

The present invention has been made in order to solve the above problems, and an object of the present invention is to provide a coated cutting tool which has excellent wear resistance and fracture resistance, under the cutting conditions for high-speed machining on, in particular, difficult-to-machine materials, such as stainless cast steel and heat resisting steel, and which accordingly allows for machining over a long period of time.

Solution to Problem

The present inventor has conducted studies regarding the extension of the tool life of a coated cutting tool and has then found that the following configurations allow the wear resistance and fracture resistance to be improved, and found that, as a result, the tool life of the coated cutting tool can be extended.

Namely, the gist of the present invention is as set forth below.

[1] A coated cutting tool comprising a substrate and a coating layer formed on a surface of the substrate, the coating layer comprising a first laminate structure and a second laminate structure, wherein:

the first laminate structure has a laminate structure in which compound layers of two kinds, each having a different composition, are laminated in an alternating manner;

one compound layer of the compound layers of two kinds in the first laminate structure has a composition represented by formula (1) below:

$$(Al_a M_{1-a})N \qquad (1)$$

[wherein M denotes an element of at least one kind selected from the group consisting of Ti, Zr, Hf, V, Nb, Ta, Cr, Mo, W and Si, a denotes an atomic ratio of the Al element based on a total of the Al element and a metal element denoted by M, and a satisfies $0.58 \leq a \leq 0.80$];

the other compound layer of the compound layers of two kinds in the first laminate structure has a composition represented by formula (2) below:

$$(Al_b M_{1-b})N \qquad (2)$$

[wherein M denotes an element of at least one kind selected from the group consisting of Ti, Zr, Hf, V, Nb, Ta, Cr, Mo, W and Si, b denotes an atomic ratio of the Al element based on a total of the Al element and a metal element denoted by M, and b satisfies $0.57 \leq b \leq 0.79$];

the first laminate structure satisfies a condition represented by formula (A) below:

$$0 < |Rx - Ry| < 5 \qquad (A)$$

[wherein Rx denotes a ratio (unit:atom %) of a metal element of one kind relative to all the metal elements in the one compound layer, and Ry denotes a ratio (unit:atom %) of the metal element of one kind relative to all the metal elements in the other compound layer which is adjacent to the one compound layer, and the metal element of one kind denotes an element having the largest absolute value of a difference between a ratio relative to all the metal elements in the one compound layer and a ratio relative to all the metal elements in the other compound layer];

the second laminate structure has a laminate structure in which a first compound layer and a second compound layer are laminated in an alternating manner;

the first compound layer comprises at least one kind selected from the group consisting of an oxide and an oxynitride of an element having a composition represented by formula (3) below:

$$(Al_{1-c} Cr_c) \qquad (3)$$

[wherein c denotes an atomic ratio of the Cr element based on a total of the Al element and the Cr element, and c satisfies $0 \leq c \leq 0.60$];

the second compound layer has a composition represented by formula (4) below:

$$(Al_{1-d} L_d)N \qquad (4)$$

[wherein L denotes an element of at least one kind selected from the group consisting of Ti, Zr, Hf, V, Nb, Ta, Cr, Mo, W and Si, d denotes an atomic ratio of an element denoted by L based on a total of the Al element and the metal element denoted by L, and d satisfies $0 \leq d \leq 0.55$];

an average thickness of each of the one compound layer and the other compound layer which constitute the first laminate structure is from 1 nm or more to 300 nm or less;
an average thickness of each of the first compound layer and the second compound layer which constitute the second laminate structure is from 50 nm or more to 500 nm or less; and
a thickness of the coating layer in its entirety is from 1.5 μm or more to 15.0 μm or less.

[2] The coated cutting tool according to [1], wherein the |Rx−Ry| is from 1 atom % or higher to 4 atom % or lower.

[3] The coated cutting tool according to [1] or [2], wherein the first compound layer has a composition represented by formula (5) or (6) below:

$$(Al_{1-c}Cr_c)_2O_3 \quad (5)$$

$$(Al_{1-c}Cr_c)(N_{1-e}O_e) \quad (6)$$

[wherein c denotes an atomic ratio of the Cr element based on a total of the Al element and the Cr element, e denotes an atomic ratio of the O element based on a total of the N element and the O element, and c and e respectively satisfy 0≤c≤0.60 and 0<e≤1].

[4] The coated cutting tool according to any of [1] to [3], wherein the coating layer comprises a structure in which two or more laminate structures, each of which is either the first laminate structure or the second laminate structure, are laminated in an alternating manner.

[5] The coated cutting tool according to any of [1] to [4], wherein an average thickness of the first laminate structure is from 0.1 μm or more to 10.0 μm or less.

[6] The coated cutting tool according to any of [1] to [5], wherein an average thickness of the second laminate structure is from 0.2 μm or more to 10.0 μm or less.

[7] The coated cutting tool according to any of [1] to [6], wherein an average grain size of the first laminate structure is from 10 nm or more to 450 nm or less.

[8] The coated cutting tool according to any of [1] to [7], wherein an average grain size of the second laminate structure is from 5 nm or more to 300 nm or less.

[9] The coated cutting tool according to any of [1] to [8], wherein:
the coating layer includes a lower layer located so as to be closer to the substrate than the first laminate structure and the second laminate structure;
the lower layer is a compound layer of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 μm or more to 3.5 μm or less.

[10] The coated cutting tool according to any of [1] to [9], wherein:
the coating layer includes an upper layer on a side of the first laminate structure and the second laminate structure which is opposite to the substrate;
the upper layer is a compound layer of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 μm or more to 3.5 μm or less.

[11] The coated cutting tool according to any of [1] to [10], wherein the substrate is a cemented carbide, cermet, ceramics or a cubic boron nitride sintered body.

Advantageous Effects of Invention

The coated cutting tool of the present invention has excellent wear resistance and fracture resistance and accordingly allows for an extended tool life.

BRIEF DESCRIPTION OF DRAWINGS

The FIGURE is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

The coated cutting tool of the present embodiment is a coated cutting tool comprising a substrate and a coating layer formed on a surface of the substrate,
the coating layer comprising a first laminate structure and a second laminate structure, wherein:
the first laminate structure has a laminate structure in which compound layers of two kinds, each having a different composition, are laminated in an alternating manner;
one compound layer of the compound layers of two kinds in the first laminate structure has a composition represented by formula (1) below:

$$(Al_aM_{1-a})N \quad (1)$$

[wherein M denotes an element of at least one kind selected from the group consisting of Ti, Zr, Hf, V, Nb, Ta, Cr, Mo, W and Si, a denotes an atomic ratio of the Al element based on a total of the Al element and a metal element denoted by M, and a satisfies 0.58≤a≤0.80];
the other compound layer of the compound layers of two kinds in the first laminate structure has a composition represented by formula (2) below:

$$(Al_bM_{1-b})N \quad (2)$$

[wherein M denotes an element of at least one kind selected from the group consisting of Ti, Zr, Hf, V, Nb, Ta, Cr, Mo, W and Si, b denotes an atomic ratio of the Al element based on a total of the Al element and a metal element denoted by M, and b satisfies 0.57≤b≤0.79];
the first laminate structure satisfies a condition represented by formula (A) below:

$$0<|Rx-Ry|<5 \quad (A)$$

[wherein Rx denotes a ratio (unit:atom %) of a metal element of one kind relative to all the metal elements in the one compound layer, and Ry denotes a ratio (unit:atom %) of the metal element of one kind relative to all the metal elements in the other compound layer which is adjacent to the one compound layer, and the metal element of one kind denotes an element having the largest absolute value of a difference between a ratio relative to all the metal elements in the one compound layer and a ratio relative to all the metal elements in the other compound layer];
the second laminate structure has a laminate structure in which a first compound layer and a second compound layer are laminated in an alternating manner;

the first compound layer comprises at least one kind selected from the group consisting of an oxide and an oxynitride of an element having a composition represented by formula (3) below:

$$(Al_{1-c}Cr_c) \quad (3)$$

[wherein c denotes an atomic ratio of the Cr element based on a total of the Al element and the Cr element, and c satisfies 0≤c≤0.60];

the second compound layer has a composition represented by formula (4) below:

$$(Al_{1-d}L_d)N \quad (4)$$

[wherein L denotes an element of at least one kind selected from the group consisting of Ti, Zr, Hf, V, Nb, Ta, Cr, Mo, W and Si, d denotes an atomic ratio of an element denoted by L based on a total of the Al element and the metal element denoted by L, and d satisfies 0≤d≤0.55];

an average thickness of each of the one compound layer and the other compound layer which constitute the first laminate structure is from 1 nm or more to 300 nm or less;

an average thickness of each of the first compound layer and the second compound layer which constitute the second laminate structure is from 50 nm or more to 500 nm or less; and a thickness of the coating layer in its entirety is from 1.5 μm or more to 15.0 μm or less.

The coated cutting tool of the present embodiment comprises the above-described configurations, and this allows the wear resistance and fracture resistance of the coated cutting tool to be improved; as a result, the tool life of the coated cutting tool can be extended. The major factors for the improvements in wear resistance and fracture resistance of the coated cutting tool of the present embodiment can be considered to be set forth as follows. However, such factors are not limited thereto.

(1) The average thickness of the entire coating layer is 1.5 μm or more, and this leads to an improvement of wear resistance. The average thickness of the entire coating layer is 15.0 μm or less, and this provides excellent adhesion of the coating layer with respect to the substrate, thereby resulting in an improvement of fracture resistance.

(2) The compound layers of two kinds which constitute the first laminate structure each comprise a combination of elements of specific kinds, and this leads to an improvement of wear resistance.

(3) The Al content in each of the compound layers of two kinds which constitute the first laminate structure has a specific value or more, and this suppresses a reduction in the oxidation resistance, thereby resulting in an improvement of fracture resistance. Further, the Al content in each of the compound layers of two kinds which constitute the first laminate structure has a specific value or less, and this reduces the existence ratio of hexagonal crystals, thereby resulting in an improvement of wear resistance.

(4) A specific metal element regarding which |Rx−Ry| in formula (A) falls within the specific range exists, and this maintains the adhesion between the one compound layer and the other compound layer high, thereby leading to a low degree of mismatching of crystal lattices in the interface between the compound layers of two kinds. This prevents the residual compressive stress of the first laminate structure from being increased, thereby resulting in an improvement of fracture resistance.

(5) One of the compound layers (the first compound layer) which constitute the second laminate structure has a specific composition, and the Cr content has a specific value or less, and this allows the oxidation rate of the compound layer to be decreased, thereby resulting in an improvement of wear resistance at high temperatures.

(6) The other compound layer (the second compound layer) which constitutes the second laminate structure has a specific composition, and this leads to an improvement of wear resistance. The content of the specific metal element (the metal element denoted by L) has a specific value or less, and this leads to a reduced hardness of the compound layer, thereby resulting in an improvement of wear resistance.

(7) The average thickness of each of the compound layers of two kinds which constitute the first laminate structure has a specific value or less, and this leads to an improvement in the hardness of the first laminate structure, thereby resulting in an improvement of fracture resistance.

(8) The average thickness of each of the compound layers of two kinds which constitute the second laminate structure has a specific value or less, and this leads to an improvement in the hardness of the second laminate structure, thereby resulting in an improvement of fracture resistance.

The coated cutting tool of the present embodiment includes a substrate and a coating layer provided on the substrate. Specific examples of types of the coated cutting tool include an indexable cutting insert for milling or turning, a drill, an end mill, etc.

The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is preferably any of a cemented carbide, cermet, ceramics and a cubic boron nitride sintered body because further excellent wear resistance and fracture resistance can be provided, and the substrate is more preferably cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided, even if the substrate surface has been modified in this way.

As to the entire coating layer in the present embodiment, the average thickness thereof is from 1.5 μm or more to 15.0 μm or less. If the average thickness is 1.5 μm or more, wear resistance is improved, and if such average thickness is 15.0 μm or less, this provides excellent adhesion of the coating layer with respect to the substrate, thereby resulting in an improvement of fracture resistance. From the same perspective, the average thickness of the entire coating layer is preferably from 1.5 μm or more to 6.5 μm or less, and is further preferably from 1.5 μm or more to 6.0 μm or less. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and calculating the arithmetic mean of the resulting measurements.

The coating layer of the present embodiment includes a first laminate structure in which compound layers of two kinds, each kind having a different composition, are laminated in an alternating manner. It should be noted, however, that the first laminate structure of the present embodiment may include a layer (hereinafter simply referred to as the "other layer") having a composition different from that of each of the above compound layers of two kinds, unless this hinders the operation and effects of the present invention. When the first laminate structure includes the other layer, such other layer may be laminated so as to be adjacent to two layers consisting of the compound layers of two kinds, by way of example. If the coating layer includes such first laminate structure, this leads to an increased hardness of the coating layer, thereby resulting in an improvement of wear resistance. Herein, the term "having a different composition" means that, as to compound layers of two kinds, the absolute value of the difference between the ratio (atom %) of a metal element (hereinafter also referred to as a "specific metal element") contained in one of the compound layers relative to all the metal elements (100 atom %) contained therein and the ratio (atom %) of the metal element contained in the other compound layer relative to all the metal elements (100 atom %) contained therein (hereinafter also referred to as an "absolute value of a difference"), is more than 0 atom %. In the present description, Si element is included in a metal element.

One compound layer of the compound layers of two kinds in the first laminate structure of the present embodiment is a compound layer having the composition represented by formula (1) above. It should be noted, however, that the above compound layer may contain other components (elements), unless this hinders the operation and effects of the present invention. In formula (1) above, M denotes a metal element of at least one kind selected from the group consisting of Ti, Zr, Hf, V, Nb, Ta, Cr, Mo, W and Si, a denotes an atomic ratio of the Al element based on a total of the Al element and a metal element denoted by M, and a satisfies $0.58 \leq a \leq 0.80$. If the atomic ratio a is 0.58 or more, this leads to a large content of Al, and this suppresses a reduction in the oxidation resistance, thereby resulting in an improvement of fracture resistance, whereas, if the atomic ratio a of the Al element is 0.80 or less, this leads to a reduced existence ratio of hexagonal crystals, thereby resulting in an improvement of wear resistance. Therefore, the atomic ratio a of the Al element satisfying $0.58 \leq a \leq 0.80$ allows wear resistance and fracture resistance to be improved with good balance. From the same perspective, the atomic ratio a of the Al element preferably satisfies $0.60 \leq a \leq 0.80$ and more preferably satisfies $0.65 \leq a \leq 0.75$.

Further, the other compound layer of one kind out of two kinds (the other compound layer) is a compound layer comprised of the composition represented by formula (2) above. It should be noted, however, that the other compound layer may contain other components (elements), unless this hinders the operation and effects of the present invention. In formula (2) above, M denotes a metal element of at least one kind selected from the group consisting of Ti, Zr, Hf, V, Nb, Ta, Cr, Mo, W and Si, b denotes an atomic ratio of the Al element based on a total of the Al element and a metal element denoted by M, and b satisfies $0.57 \leq b \leq 0.79$. If the atomic ratio b is 0.57 or more, this leads to a large content of Al, and this suppresses a reduction in the oxidation resistance, thereby resulting in an improvement of fracture resistance, whereas, if the atomic ratio b is 0.79 or less, this leads to a reduced existence ratio of hexagonal crystals, thereby resulting in an improvement of wear resistance. Therefore, the atomic ratio b of the Al element satisfying $0.57 \leq b \leq 0.79$ allows wear resistance and fracture resistance to be improved with good balance. From the same perspective, the atomic ratio b of the Al element preferably satisfies $0.58 \leq b \leq 0.77$ and more preferably satisfies $0.63 \leq b \leq 0.71$.

Moreover, the following conditions are satisfied simultaneously: the atomic ratio a satisfies the above range in one of the compound layers; and the atomic ratio b satisfies the above range in the other compound layer, and this allows wear resistance and fracture resistance to be improved with good balance in a synergistic manner.

Since the metal element denoted by M is at least one kind selected from the group consisting of Ti, Zr, Hf, V, Nb, Ta, Cr, Mo, W and Si, this leads to an improvement of wear resistance. From the same perspective, the metal element denoted by M is preferably at least one kind selected from the group consisting of Ti, Zr, Hf, V, Ta, Cr, Mo, W and Si.

It is preferable that at least part of the kinds of the metal elements contained in the one compound layer which constitutes the first laminate structure of the present embodiment is in common with the other compound layer which constitutes the first laminate structure, and it is more preferable that all of the kinds of the metal elements contained in the one compound layer which constitutes the first laminate structure of the present embodiment are in common with the other compound layer which constitutes the first laminate structure. In other words, each of the compound layers of two kinds which constitute the first laminate structure is more preferably constituted by the same kinds of metal elements.

Further, the first laminate structure satisfies the condition represented by formula (A).

$$0 < |Rx - Ry| < 5 \tag{A}$$

In formula (A), Rx denotes a ratio (unit:atom %) of a metal element of one kind (also referred to as a "specific metal element γ") relative to all the metal elements in the one compound layer, and Ry denotes a ratio (unit:atom %) of the metal element of one kind (the specific metal element γ) relative to all the metal elements in the other compound layer which is adjacent to the one compound layer. The specific metal element γ denotes an element having the largest absolute value of a difference between a ratio relative to all the metal elements in the one compound layer and a ratio relative to all the metal elements in the other compound layer.

That is, the absolute value of the difference between the ratio (atom %) of the specific metal element γ contained in a compound layer relative to all the metal elements (100 atom %) contained therein and the ratio (atom %) of the specific metal element γ contained in the other compound layer which is adjacent to the compound layer relative to all the metal elements (100 atom %) contained therein, is more than 0 atom % and less than 5 atom %. The "ratio of a specific metal element γ" refers to a ratio (atom %) of the number of atoms of the specific metal element γ contained in each compound layer relative to the number of atoms of all the metal elements contained in each compound layer.

When the first laminate structure satisfies the condition represented by formula (A) above, this does not lead to a reduction in the adhesion between a compound layer and the other compound layer which is adjacent to the compound layer, thereby resulting in a low degree of mismatching of crystal lattices in the interface between the compound layers of two kinds. Thus, the residual compressive stress of the first laminate structure is prevented from being increased, thereby resulting in an improvement of fracture resistance. From the same perspective, |Rx−Ry| is preferably from 1 atom % or higher to 4 atom % or lower. It should be noted that the feature in which the absolute value of the difference between the ratio (atom %) of each metal element contained in a compound layer which constitutes the first laminate structure relative to all the metal elements contained therein and the ratio (atom %) of each metal element contained in the other compound layer which is adjacent to the compound layer and which constitutes the first laminate structure relative to all the metal elements contained therein, is 0 atom %, indicates a single layer structure. In such case, a single layer structure has a hardness lower than that of the first laminate structure and is therefore inferior in terms of wear resistance.

The coating layer of the present embodiment includes a second laminate structure in which first compound layers and second compound layers are laminated in an alternating manner. It should be noted, however, that the second laminate structure of the present embodiment may include a layer (hereinafter simply referred to as the "other layer") having a composition different from that of each of the above compound layers of two kinds, unless this hinders the operation and effects of the present invention. When the second laminate structure includes the other layer, such other layers may be laminated so as to be adjacent to two layers consisting of the compound layers of two kinds, by way of example. If the coating layer includes such second laminate structure, this leads to an increased hardness of the coating layer, thereby resulting in an improvement of wear resistance. The second laminate structure of the present embodiment may be a structure in which a total of three or more layers, each of which is either of the compound layers of two kinds, each having a different composition, are laminated in turn.

The first compound layer in the second laminate structure of the present embodiment is a compound layer having the composition represented by formula (3) above and comprising at least one kind selected from the group consisting of an oxide and an oxynitride. In formula (3) above, c denotes an atomic ratio of the Cr element based on a total of the Al element and the Cr element, c satisfies $0 \le c \le 0.60$, and the atomic ratio c is preferably more than 0 and 0.60 or less. If the atomic ratio c is more than 0, this leads to a further improvement of fracture resistance. Meanwhile, if the atomic ratio c of the Cr element is 0.60 or less, this allows for a reduced oxidation rate of the compound layer. This leads to an improvement of wear resistance at high temperatures. From the same perspective, the atomic ratio c more preferably satisfies $0.10 \le c \le 0.50$ and further preferably satisfies $0.20 \le c \le 0.50$.

In the second laminate structure of the present embodiment, the first compound layer is preferably a compound layer having the composition represented by formula (5) or (6) below:

$(Al_{1-c}Cr_c)_2O_3$        (5)

$(Al_{1-c}Cr_c)(N_{1-e}O_e)$        (6)

[wherein c denotes an atomic ratio of the Cr element based on a total of the Al element and the Cr element, e denotes an atomic ratio of the O element based on a total of the N element and the O element, and c and e respectively satisfy $0 \le c \le 0.60$ and $0 < e \le 1$].

The second compound layer in the second laminate structure of the present embodiment is a layer having the composition represented by formula (4) above. Herein, L denotes an element of at least one kind selected from the group consisting of Ti, Zr, Hf, V, Nb, Ta, Cr, Mo, W and Si, d denotes an atomic ratio of an element denoted by L based on a total of the Al element and the element denoted by L, and d satisfies $0 \le d \le 0.55$ and preferably satisfies $0 < d \le 0.55$. If the atomic ratio d is more than 0, this leads to a further improvement of fracture resistance. Meanwhile, if the atomic ratio d is 0.55 or less, this suppresses a reduction in the hardness of the compound layer, thereby resulting in an improvement of wear resistance. From the same perspective, the atomic ratio d more preferably satisfies $0.10 \le d \le 0.50$ and further preferably satisfies $0.20 \le d \le 0.50$.

Further, the element represented by L which constitutes a compound layer is at least one kind selected form the group consisting of Ti, Zr, Hf, V, Nb, Ta, Cr, Mo, W and Si, thereby resulting in an improvement of wear resistance. From the same perspective, the element represented by L which constitutes a compound layer is preferably at least one kind selected from the group consisting of Ti, Zr, V, Nb, Ta, Cr, Mo, W and Si.

The second laminate structure is constituted by the first compound layer and the second compound layer, and this eliminates an area having a locally high internal stress in the second laminate structure, thereby resulting in an improvement of fracture resistance.

Two or more laminate structures, each of which is either the first laminate structure or the second laminate structure, are preferably laminated in an alternating manner because this provides the effect of suppressing the progress of cracking, thereby leading to an improvement of fracture resistance.

In the present embodiment, for example, when the composition of a compound layer is represented by $(Al_{0.60}Ti_{0.40})N$, such representation indicates that the atomic ratio of the Al element based on a total of the Al element and the Ti element is 0.60 and that the atomic ratio of the Ti element based thereon is 0.40. That is, such representation indicates that the amount of the Al element based on a total of the Al element and the Ti element is 60 atom % and that the amount of the Ti element based thereon is 40 atom %.

Regarding formula (A) above, "$0<|Rx-Ry|<5$," more detailed description will be made below. For example, when the first laminate structure is constituted by a $(Al_{0.67}Ti_{0.33})N$ layer (the one compound layer) and a $(Al_{0.70}Ti_{0.30})N$ layer (the other compound layer), the two compound layers contain the same kinds of metal elements. This is because the two compound layers each contain the Al element and the Ti element as metal elements. In such case, the number of atoms of the Al element contained in the $(Al_{0.67}Ti_{0.33})N$ layer (the other compound layer) constitutes 67 atom % based on the number of atoms of all the metal elements (100 atom %). The number of atoms of the Al element contained in the $(Al_{0.70}Ti_{0.30})N$ layer (the other compound layer) constitutes 70 atom % based on the number of atoms of all the metal elements (100 atom %). The difference in the number of atoms of the Al element between the above two compound layers (absolute value of a difference) is 3 atom %. Therefore, an element having the largest difference in the number of atoms among the metal elements is the Al element (or the Ti element), and the Al element (or the Ti element) therefore falls into the specific metal element γ. The difference in the number of atoms of the Al element (or the Ti element) between the above two compound layers is 3 atom %, and thus, this case satisfies the above condition that "the absolute value of the difference . . . is more than 0 atom % and less than 5 atom %."

Further, for example, when the first laminate structure is constituted by a $(Al_{0.65}Ti_{0.30}Cr_{0.05})N$ layer (the one compound layer) and a $(Al_{0.68}Ti_{0.29}Cr_{0.03})N$ layer (the other compound layer), the two compound layers contain the same kinds of metal elements. This is because the two compound layers each contain the Al element, the Ti element and the Cr element as metal elements. In such case, the difference in the number of atoms of the Ti element between the two compound layers (absolute value of a difference) is 1 atom %. The difference in the number of atoms of the Cr element between the two compound layers (absolute value of a difference) is 2 atom %. Moreover, the difference in the number of atoms of Al between the two compound layers is 3 atom %. Therefore, an element having the largest difference in the number of atoms among the metal elements is the Al element (or the Ti element), and the Al element (or the Ti element) therefore falls into the specific metal element γ. The difference in the number of atoms of the Al element between the above two compound layers is 3 atom %, and thus, this case satisfies the above condition that "the absolute value of the difference . . . is more than 0 atom % and less than 5 atom %."

In the present embodiment, when one compound layer of each of two kinds, each kind having a different composition, is formed, the "number of repeats" is one. The FIGURE is a schematic view showing an example of a cross-sectional structure of the coated cutting tool of the present embodiment, and this will be used below in order to describe the number of repeats. This coated cutting tool 11 includes a substrate 1 and a coating layer 10 formed on a surface of the substrate 1. The coating layer 10 includes a lower layer 2, a first laminate structure 8, a second laminate structure 9 and an upper layer 7, and these components are laminated in this order. The first laminate structure 8 is a laminate structure obtained by laminating, in an alternating manner, respective compound layers, i.e., an A1 layer 3 and a B1 layer 4, whose composition is different from that of the A1 layer 3, in order from the lower layer 2 side to the upper layer 7 side, and the laminate structure includes two A1 layers 3 and two B1 layers 4. The second laminate structure 9 is a laminate structure obtained by laminating, in an alternating manner, respective compound layers, i.e., an A2 layer 5 and a B2 layer 6, whose composition is different from that of the A2 layer 5, in order from the lower layer 2 side to the upper layer 7 side, and the laminate structure includes two A2 layers 5 and two B2 layers 6. In each of the above cases, the number of repeats is two. Further, for example, when forming five A1 layers 3 and five B1 layers 4, i.e., an A1 layer 3, a B1 layer 4, an A1 layer 3, a B1 layer 4, an A1 layer 3, a B1 layer 4, an A1 layer 3, a B1 layer 4, an A1 layer 3, a B1 layer 4, in order from the lower layer 2 side to the upper layer 7 side, the number of repeats is five. Herein, the A1 layer 3 may be a compound layer having the composition represented by $(Al_aM_{1-a})N$, and the B1 layer 4 may be a compound layer having the composition represented by $(Al_bM_{1-b})N$. Alternatively, the A1 layer 3 may be a compound layer having the composition represented by $(Al_bM_{1-b})N$, and the B1 layer 4 may be a compound layer having the composition represented by $(Al_aM_{1-a})N$. Similarly, the A2 layer 5 may be a compound layer comprising a compound of at least one kind selected from the group consisting of an oxide and an oxynitride of an element having the composition represented by $(Al_{1-c}Cr_c)$, and the B2 layer 6 may be a compound layer comprising a compound having the composition represented by $(Al_{1-d}L_d)N$. Alternatively, the A2 layer 5 may be a compound layer comprising a compound having the composition represented by $(Al_{1-d}L_d)N$, and the B2 layer 6 may be a compound layer comprising a compound of at least one kind selected from the group consisting of an oxide and an oxynitride of an element having the composition represented by $(Al_{1-c}Cr_c)$. Although, in the FIGURE, the coating layer 10 includes both the lower layer 2 and the upper layer 7, the coating layer may instead include only either one of the lower layer 2 and the upper layer 7, or include neither of such two layers.

The coating layer of the present embodiment includes one or more first laminate structures and one or more second laminate structures, where such first and second laminate structures are laminated. The order of laminating between the first and second laminate structures is not particularly limited. From the substrate side, first laminate structures and second laminate structures may be laminated in an alternating manner in this order, or second laminate structures and first laminate structures may be laminated in an alternating manner in this order. However, from the perspective of providing the operation and effects of the present invention more effectively and reliably, the former order is preferably employed. Further, the number of laminate structures (the total number of first laminate structures and second laminate structures) is not particularly limited, as long as the number is two or more. The number may be, for example, from two to six, and from the perspective of providing the operation and effects of the present invention more effectively and reliably, the number is preferably from two to four and is more preferably two or three. When the number of laminate structures is three, a first laminate structure, a second laminate structure and a first laminate structure are laminated in this order, by way of example.

The average thickness of each of the one compound layer and the other compound layer which constitute the first laminate structure of the present embodiment is from 1 nm or more to 300 nm or less. If the average thickness of each layer is 1 nm or more, it becomes easier to form compound layers each having a uniform thickness. If the average thickness of each layer is 300 nm or less, this leads to an increased hardness of the first laminate structure, thereby resulting in an improvement of fracture resistance. From the same perspective, the average thickness of each layer is preferably from 2 nm or more to 250 nm or less, and is more preferably from 4 nm or more to 200 nm or less.

The average thickness of each of the first compound layer and the second compound layer which constitute the second laminate structure of the present embodiment is from 50 nm or more to 500 nm or less. If the average thickness of each layer is 50 nm or more, it becomes easier to form compound layers each having a uniform thickness. If the average thickness of each layer is 500 nm or less, this leads to an increased hardness of the second laminate structure, thereby resulting in an improvement of fracture resistance. From the same perspective, the average thickness of each layer is preferably from 50 nm or more to 400 nm or less, and is more preferably from 50 nm or more to 300 nm or less.

In the present embodiment, the average thickness of the first laminate structure is preferably from 0.1 μm or more to 10.0 μm or less. If the average thickness of the first laminate structure is 0.1 μm or more, wear resistance is further improved, and if the average thickness of the first laminate structure is 10.0 μm or less, fracture resistance is further improved. From the same perspective, the average thickness of the first laminate structure is preferably from 1.5 μm or more to 6.0 μm or less.

In the present embodiment, the average thickness of the second laminate structure is preferably from 0.2 μm or more to 10.0 μm or less. If the average thickness of the second laminate structure is 0.2 μm or more, wear resistance is further improved, and if the average thickness of the second laminate structure is 10.0 μm or less, fracture resistance is further improved. From the same perspective, the average thickness of the second laminate structure is preferably from 1.5 μm or more to 6.0 μm or less.

In the present embodiment, the average grain size of the first laminate structure is preferably from 10 nm or more to 450 nm or less. If the average grain size of the first laminate structure is 10 nm or more, this indicates the tendency of the reduction in wear resistance to be further suppressed, and if the average grain size of the first laminate structure is 450 nm or less, this indicates the tendency of the reduction in fracture resistance to be further suppressed. From the same perspective, the average grain size of the first laminate structure is more preferably from 10 nm or more to 430 nm or less.

In the present embodiment, the average grain size of the second laminate structure is preferably from 5 nm or more to 300 nm or less. If the average grain size of the second laminate structure is 5 nm or more, this indicates the tendency of the reduction in wear resistance to be further suppressed, and if the average grain size of the second laminate structure is 300 nm or less, this indicates the tendency of the reduction in fracture resistance to be further suppressed. From the same perspective, the average grain size of the second laminate structure is more preferably from 20 nm or more to 250 nm or less.

The average grain size of the first laminate structure in the present embodiment can be measured from a cross-sectional structure in a direction orthogonal to a surface of a substrate in a coated cutting tool (i.e., a cross-sectional structure viewed from the direction shown in the FIGURE), using a transmission electron microscope (TEM). More specifically, a cross-sectional structure of the coated cutting tool is observed with the TEM, and an image magnified 10,000 to 80,000 times is taken. A line (with a width equal to 200 nm) parallel with the substrate surface is drawn on the taken image. At this time, such line is drawn so as to traverse the structure of the first laminate structure. The value obtained by dividing the length (diameter) of the particles included in the line by the number of particles contained on the line is regarded as a grain size of the first laminate structure. Grain sizes of the first laminate structure are measured respectively from the lines drawn at five or more locations, and the arithmetic mean of the obtained values is defined as an average grain size of the first laminate structure. The average grain size of the second laminate structure can be obtained through the same method.

The coating layer of the present embodiment may be comprised of the first and second laminate structures alone. However, it is preferable for a lower layer to be provided between the substrate and the first and second laminate structures (i.e., located so as to be closer to the substrate than the first and second laminate structures) because the adhesion between the substrate and the first or second laminate structure is further improved. In particular, the lower layer, from the same perspective as that set forth above, preferably comprises a compound of: an element of at least one kind selected from the group consisting of Ti, Zr, Hf, V, Nb, Ta, Cr, Mo, W, Al, Si and Y; and an element of at least one kind selected from the group consisting of C, N, O and B (preferably, the N element), is more preferably a layer of a compound of: an element of at least one kind selected from the group consisting of Ti, Nb, Cr, W, Al and Si; and an element of at least one kind selected from the group consisting of C, N, O and B, is further preferably a layer of a compound of: an element of at least one kind selected from the group consisting of Ti and Al; and an element of at least one kind selected from the group consisting of C, N, O and B (preferably, the N element), and is particularly preferably a layer of a compound of: an element of at least one kind selected from the group consisting of Ti and Al; and the N element. It should be noted, however, that the lower layer is different from the compound layers in the first and second laminate structures in terms of their respective compositions. Further, the lower layer may be a single layer or multiple layers of two or more layers.

In the present embodiment, the average thickness of the lower layer is preferably from 0.1 μm or more to 3.5 μm or less. The average thickness of the lower layer falling within the above range indicates the tendency of the adhesion between the substrate and the coating layer to be further improved. From the same perspective, the average thickness of the lower layer is more preferably from 0.1 μm or more to 3.0 μm or less, and is further preferably from 0.1 μm or more to 2.5 μm or less.

The coating layer of the present embodiment may have an upper layer on a side of the first and second laminate structures which are opposite to the substrate (i.e., on a surface of the first laminate structure or the second laminate structure). The upper layer is preferably a layer of a compound of: an element of at least one kind selected from the group consisting of Ti, Zr, Hf, V, Nb, Ta, Cr, Mo, W, Al, Si and Y; and an element of at least one kind selected from the group consisting of C, N, O and B (preferably the N element) because further excellent wear resistance is achieved. From the same perspective, the upper layer is more preferably a layer of a compound of: an element of at least one kind selected from the group consisting of Ti, Nb, Cr, W, Al and Si; and an element of at least one kind selected from the group consisting of C, N, O and B (preferably the N element), and is further preferably a layer of a compound of: an element of at least one kind selected from the group consisting of Ti, Cr, Al and Si; and N. It should be noted, however, that the upper layer is different from the compound layers in the first and second laminate structures in terms of their respective compositions. Further, the upper layer may be a single layer or multiple layers of two or more layers.

In the present embodiment, the average thickness of the upper layer is preferably from 0.1 μm or more to 3.5 μm or less. The average thickness of the upper layer falling within the above range indicates the tendency of wear resistance to be further excellent. From the same perspective, the average thickness of the upper layer is more preferably from 0.2 μm or more to 3.0 μm or less.

A method of manufacturing a coating layer in a coated cutting tool according to the present embodiment is not particularly limited. For example, a coating layer can be obtained by forming, in order, the compound layers in the above-described first and second laminate structures by a physical vapor deposition method, such as an ion plating method, an arc ion plating method, a sputtering method or an ion mixing method. In particular, a coating layer formed by the arc ion plating method has high adhesion with the substrate. Therefore, from among the above methods, the arc ion plating method is preferred.

A method of manufacturing a coated cutting tool according to the present embodiment will now be described using specific examples. It should be noted that the method of manufacturing a coated cutting tool according to the present embodiment is not particularly limited, as long as the configurations of the coated cutting tool may be achieved.

Firstly, a substrate processed in a tool shape is received in a reactor of a physical vapor deposition apparatus, and metal evaporation sources are placed in the reactor. Thereafter, the reactor is evacuated until the pressure therein becomes $1.0 \times 10^{-2}$ Pa or lower, and the substrate is heated, by a heater in the reactor, until the temperature becomes 600° C. or higher to 700° C. or lower. After the heating, an Ar gas is introduced into the reactor so that the pressure in the reactor is 0.5 Pa or higher to 5.0 Pa or lower. In the Ar gas atmosphere with a pressure of 0.5 Pa or higher to 5.0 Pa or lower, under the conditions that: a bias voltage of from −350 V or higher to −500 V or lower is applied to the substrate; and a current of 40 A or higher to 50 A or lower is caused to flow through a tungsten filament in the reactor, an ion bombardment process is carried out, with the Ar gas, on a surface of the substrate. After the ion bombardment process is carried out on the substrate surface, the reactor is evacuated until the pressure therein becomes $1.0 \times 10^{-2}$ Pa or lower.

Then, the substrate is heated until the temperature is from 250° C. or higher to 500° C. or lower by adjusting the temperature of the heater, and a reaction gas, such as a nitrogen gas, is then introduced into the reactor. Thereafter, the pressure in the reactor is set at from 2.0 Pa or higher to 4.0 Pa or lower, and a bias voltage of from −60 V or higher to −150 V or lower is applied to the substrate. Then, a metal evaporation source according to the metal components of each layer is evaporated via an arc discharge, whereby each layer of a first laminate structure can be formed on the substrate surface. At this time, two or more kinds of metal evaporation sources which are placed at positions separate from each other are simultaneously evaporated via an arc discharge while rotating a table to which the substrate is fixed, whereby each compound layer which constitutes the first laminate structure can be formed. In such case, by adjusting the number of revolutions of the rotating table to which the substrate in the reactor is fixed, the thickness of each compound layer which constitutes the first laminate structure can be controlled. Alternatively, the two or more kinds of metal evaporation sources are evaporated in an alternating manner via an arc discharge, whereby each compound layer which constitutes the first laminate structure can be formed. In such case, by adjusting the arc discharge time for each of the metal evaporation sources, the thickness of each compound layer which constitutes the first laminate structure can be controlled.

Then, the substrate is heated such that the temperature is from 500° C. or higher to 800° C. or lower by adjusting the temperature of the heater, and, when forming a first compound layer, an oxygen gas, or an oxygen gas and a nitrogen gas, is/are then introduced into the reactor. At this time, the atomic ratio of the O element based on a total of the N element and the O element in the oxynitride can be controlled by adjusting the mixing ratio between the oxygen gas and the nitrogen gas. Further, when forming a second compound layer, a nitrogen gas is introduced into the reactor. Thereafter, the pressure in the reactor is set at from 0.5 Pa or higher to 4.0 Pa or lower, and a bias voltage of from −60 V or higher to −150 V or lower is applied to the substrate. Then, a metal evaporation source according to the metal components of each layer of a second laminate structure is evaporated via an arc discharge, whereby each layer of the second laminate structure can be formed on the substrate surface. At this time, two or more kinds of metal evaporation sources which are placed at positions separate from each other are simultaneously evaporated via an arc discharge while rotating the table to which the substrate is fixed, whereby each compound layer which constitutes the second laminate structure can be formed. In such case, by adjusting the number of revolutions of the rotating table to which the substrate in the reactor is fixed, the thickness of each compound layer which constitutes the second laminate structure can be controlled. Alternatively, the two or more kinds of metal evaporation sources are evaporated in an alternating manner via an arc discharge, whereby each compound layer which constitutes the second laminate structure can be formed. In such case, by adjusting the arc discharge time for each of the metal evaporation sources, the thickness of each compound layer which constitutes the second laminate structure can be controlled. It should be noted that, in order to form first compound layers and second compound layers in an alternating manner, it is preferable for the ratio of the oxygen gas in the reactor to be gradually varied every time after the formation of each layer because the adhesion of the second laminate structure is improved.

In order to achieve the above-mentioned predetermined size of the average grain size of the first laminate structure of the present embodiment, the temperature of the substrate when the first laminate structure is formed may be set so as to be low. More specifically, comparing the case of a substrate temperature of 300° C. and the case of a substrate temperature of 500° C., the substrate temperature of 300° C. is lower, leading to a larger average grain size of the first laminate structure. Further, when using a metal evaporation source which has a low atomic ratio of the Al element based on a total of the Al element and the element denoted by M, this indicates the tendency of the average grain size of the first laminate structure to be increased. Accordingly, the average grain size of the first laminate structure can be controlled by adjusting the substrate temperature when the first laminate structure is formed and the composition of the metal evaporation source.

In order to achieve the above-mentioned predetermined size of the average grain size of the second laminate structure of the present embodiment, the pressure in the reactor when the second laminate structure is formed may be set so as to be low. More specifically, comparing the case of a pressure in the reactor of 1.0 Pa and the case of a pressure in the reactor of 3.0 Pa, the pressure in the reactor of 1.0 Pa is lower, leading to a larger average grain size of the second laminate structure.

The thickness of each layer which constitutes the coating layer in the coated cutting tool of the present embodiment can be measured, for example, from a cross-sectional structure of the coated cutting tool, using a TEM. More specifically, in the coated cutting tool, the thickness of each layer is measured from each of the cross-sectional surfaces at three or more locations near the position 50 μm from the edge of a surface facing the metal evaporation source, toward the center of such surface. The arithmetic mean of the resulting thicknesses of the respective layers can be defined as an average thickness of the layers in the coated cutting tool.

The composition of each layer which constitutes the coating layer in the coated cutting tool of the present embodiment can be determined, from a cross-sectional structure of the coated cutting tool of the present embodiment, via measurements with the use of an energy-dispersive X-ray spectroscope (EDS), a wavelength-dispersive X-ray spectroscope (WDS), or the like.

The coated cutting tool of the present embodiment provides the effect of being capable of extending the tool life compared with the prior art. The factors for the above are not limited thereto but can be considered to derive from the coated cutting tool being excellent in terms of oxidation resistance, wear resistance and fracture resistance. Specific examples of types of the coated cutting tool of the present embodiment include an indexable cutting insert for milling or turning, a drill, an end mill, etc.

EXAMPLES

Although the present invention will be described in further detail below, with examples, the present invention is not limited to such examples.

Example 1

A machined cemented carbide insert with a shape of RPMT1204EN and a composition of 91.5WC-8.5Co (mass %) was prepared as a substrate. In a reactor of an arc ion plating apparatus, a metal evaporation source was arranged so as to achieve the composition of each layer shown in Table 1. The prepared substrate was fixed to a fixation fitting of a rotating table in the reactor.

Thereafter, the reactor was evacuated until the pressure therein became $5.0 \times 10^{-3}$ Pa or lower. After the evacuation, the substrate was heated, by a heater in the reactor, until the temperature reached 600° C. After the heating, an Ar gas was introduced into the reactor such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reactor, an ion bombardment process was carried out, with the Ar gas, on a surface of the substrate for 30 minutes. After the ion bombardment process, the reactor was evacuated until the pressure therein became $5.0 \times 10^{-3}$ Pa or lower.

As to invention samples 1 to 20, after the evacuation, the substrate was heated until the temperature reached the temperature shown in Table 2 (temperature when the step was started), a nitrogen ($N_2$) gas was introduced into the reactor, and the pressure in the reactor was adjusted so as to be 4.0 Pa.

Next, the A1 layers and the B1 layers shown in Table 1 were formed in an alternating manner so as to obtain a first laminate structure. In further detail, a bias voltage of −80 V was applied to the substrate, and the A1 layers and the B1 layers were formed in an alternating manner by simultaneously evaporating a metal evaporation source for the A1 layers and a metal evaporation source for the B1 layers via an arc discharge with an arc current of 120 A. At this time, the thickness of the A1 layer and the thickness of the B1 layer were controlled by adjusting the number of revolutions of the rotating table within a range of from 1 rpm or more to 5 rpm or less so as to achieve the thicknesses shown in Table 3.

After the formation of the first laminate structure, the substrate temperature was adjusted so as to be 550° C. (temperature when the step was started). In the formation of an A2 layer, an oxygen ($O_2$) gas and a nitrogen ($N_2$) gas were introduced into the reactor at the ratio shown in Table 2, and the pressure in the reactor was adjusted so as to be the pressure shown in Table 2 in the reactor. Further, in the formation of a B2 layer, an $N_2$ gas was introduced into the reactor, and the pressure in the reactor was adjusted so as to be 3.0 Pa.

Then, the A2 layers and B2 layers shown in Table 1 were formed in an alternating manner so as to obtain a second laminate structure. In further detail, a bias voltage of −80 V was applied to the substrate, and the A2 layers and the B2 layers were formed in an alternating manner by simultaneously evaporating a metal evaporation source for the A2 layers and a metal evaporation source for the B2 layers via an arc discharge with an arc current of 120 A. At this time, the thickness of the A2 layer and the thickness of the B2 layer were controlled by adjusting the number of revolutions of the rotating table within a range of from 1 rpm or more to 5 rpm or less so as to achieve the thicknesses shown in Table 3. It should be noted that the "absolute value of a composition difference" in Table 1 refers to the "absolute value of a composition difference" between the A1 layer and the B1 layer.

After the formation of each layer with the predetermined average thickness shown in each of Tables 3 and 4 on the substrate surface, the heater was turned off, and the sample was taken out of the reactor after the temperature of the sample reached 100° C. or lower. Invention samples 1 to 20 were made through the above-described method.

TABLE 1

| | First laminate structure | | | Second laminate structure | |
|---|---|---|---|---|---|
| Sample No. | A1 layer Composition | B1 layer Composition | Absolute value of composition difference (atm %) | A2 layer Composition | B2 layer Composition |
| Invention sample 1 | $(Al_{0.70}Ti_{0.30})N$ | $(Al_{0.67}Ti_{0.33})N$ | 3 | $(Al_{0.70}Cr_{0.30})_2O_3$ | $(Al_{0.70}Cr_{0.30})N$ |
| Invention sample 2 | $(Al_{0.75}Ti_{0.25})N$ | $(Al_{0.71}Ti_{0.29})N$ | 4 | $(Al_{0.40}Cr_{0.60})_2O_3$ | $(Al_{0.50}Cr_{0.50})N$ |
| Invention sample 3 | $(Al_{0.80}Ti_{0.20})N$ | $(Al_{0.78}Ti_{0.22})N$ | 2 | $(Al_{0.70}Cr_{0.30})_2O_3$ | $(Al_{0.70}Cr_{0.30})N$ |
| Invention sample 4 | $(Al_{0.58}Ti_{0.42})N$ | $(Al_{0.57}Ti_{0.43})N$ | 1 | $Al_2O_3$ | $(Al_{0.50}Cr_{0.50})N$ |
| Invention sample 5 | $(Al_{0.70}Ti_{0.30})N$ | $(Al_{0.67}Ti_{0.33})N$ | 3 | $(Al_{0.70}Cr_{0.30})_2O_3$ | $(Al_{0.65}Ti_{0.25}Si_{0.10})N$ |
| Invention sample 6 | $(Al_{0.70}Ti_{0.20}W_{0.10})N$ | $(Al_{0.70}Ti_{0.24}W_{0.06})N$ | 4 | $(Al_{0.50}Cr_{0.50})(N_{0.95}O_{0.05})$ | $(Al_{0.50}Ti_{0.50})N$ |
| Invention sample 7 | $(Al_{0.65}Ti_{0.25}Si_{0.10})N$ | $(Al_{0.63}Ti_{0.25}Si_{0.12})N$ | 2 | $(Al_{0.70}Cr_{0.30})(N_{0.90}O_{0.10})$ | $(Al_{0.60}Ti_{0.40})N$ |
| Invention sample 8 | $(Al_{0.70}Cr_{0.30})N$ | $(Al_{0.67}Cr_{0.33})N$ | 3 | $(Al_{0.50}Cr_{0.50})_2O_3$ | AlN |
| Invention sample 9 | $(Al_{0.75}Cr_{0.15}Si_{0.10})N$ | $(Al_{0.71}Cr_{0.15}Si_{0.14})N$ | 4 | $(Al_{0.60}Cr_{0.40})(N_{0.05}O_{0.95})$ | $(Al_{0.60}Ti_{0.35}Nb_{0.05})N$ |
| Invention sample 10 | $(Al_{0.70}Ti_{0.20}Nb_{0.10})N$ | $(Al_{0.66}Ti_{0.20}Nb_{0.14})N$ | 4 | $(Al_{0.50}Cr_{0.50})_2O_3$ | $(Al_{0.45}Ti_{0.45}Ta_{0.10})N$ |

TABLE 1-continued

| Sample No. | First laminate structure A1 layer Composition | First laminate structure B1 layer Composition | Absolute value of composition difference (atm %) | Second laminate structure A2 layer Composition | Second laminate structure B2 layer Composition |
|---|---|---|---|---|---|
| Invention sample 11 | $(Al_{0.70}Ti_{0.20}Mo_{0.10})N$ | $(Al_{0.68}Ti_{0.20}Mo_{0.12})N$ | 2 | $(Al_{0.60}Cr_{0.40})(N_{0.05}O_{0.95})$ | $(Al_{0.60}Ti_{0.30}W_{0.10})N$ |
| Invention sample 12 | $(Al_{0.70}Ti_{0.20}Ta_{0.10})N$ | $(Al_{0.67}Ti_{0.20}Ta_{0.13})N$ | 3 | $Al_2O_3$ | $(Al_{0.60}Ti_{0.30}Mo_{0.10})N$ |
| Invention sample 13 | $(Al_{0.75}Ti_{0.15}Nb_{0.10})N$ | $(Al_{0.71}Ti_{0.15}Nb_{0.14})N$ | 4 | $(Al_{0.60}Cr_{0.40})(N_{0.05}O_{0.95})$ | $(Al_{0.60}Ti_{0.35}Mo_{0.05})N$ |
| Invention sample 14 | $(Al_{0.65}Cr_{0.25}Mo_{0.10})N$ | $(Al_{0.65}Cr_{0.29}Mo_{0.06})N$ | 4 | $(Al_{0.70}Cr_{0.30})(N_{0.95}O_{0.05})$ | $(Al_{0.60}Ti_{0.30}Nb_{0.05}W_{0.05})N$ |
| Invention sample 15 | $(Al_{0.60}Ti_{0.30}Nb_{0.05}W_{0.05})N$ | $Al_{0.60}Ti_{0.28}Nb_{0.07}W_{0.05})N$ | 2 | $Al_2O_3$ | $(Al_{0.60}Cr_{0.30}Si_{0.10})N$ |
| Invention sample 16 | $(Al_{0.70}Cr_{0.20}Ta_{0.10})N$ | $(Al_{0.68}Cr_{0.20}Ta_{0.12})N$ | 2 | $(Al_{0.90}Cr_{0.10})_2O_3$ | $(Al_{0.50}Ti_{0.40}V_{0.10})N$ |
| Invention sample 17 | $(Al_{0.75}Ti_{0.15}V_{0.10})N$ | $(Al_{0.71}Ti_{0.15}V_{0.14})N$ | 4 | $(Al_{0.90}Cr_{0.10})(N_{0.05}O_{0.95})$ | $(Al_{0.60}Cr_{0.30}Mo_{0.10})N$ |
| Invention sample 18 | $(Al_{0.70}Ti_{0.20}Zr_{0.10})N$ | $(Al_{0.67}Ti_{0.20}Zr_{0.13})N$ | 3 | $Al_2O_3$ | $(Al_{0.45}Cr_{0.50}Ta_{0.05})N$ |
| Invention sample 19 | $(Al_{0.70}Cr_{0.20}V_{0.10})N$ | $(Al_{0.68}Cr_{0.20}V_{0.12})N$ | 2 | $(Al_{0.50}Cr_{0.50})_2O_3$ | AlN |
| Invention sample 20 | $(Al_{0.80}Ti_{0.10}Zr_{0.10})N$ | $(Al_{0.76}Ti_{0.10}Zr_{0.14})N$ | 4 | $(Al_{0.90}Cr_{0.10})(N_{0.95}O_{0.05})$ | $(Al_{0.60}Ti_{0.35}V_{0.05})N$ |

TABLE 2

| Sample No. | First laminate structure Temperature (°C.) | Second laminate structure A2 layer Pressure (Pa) | Second laminate structure A2 layer ($O_2:N_2$) |
|---|---|---|---|
| Invention sample 1 | 350 | 1.6 | 10:0 |
| Invention sample 2 | 450 | 1.8 | 10:0 |
| Invention sample 3 | 450 | 2.0 | 10:0 |
| Invention sample 4 | 450 | 1.8 | 10:0 |
| Invention sample 5 | 350 | 1.4 | 10:0 |
| Invention sample 6 | 300 | 1.0 | 1:9 |
| Invention sample 7 | 450 | 1.4 | 1:9 |
| Invention sample 8 | 300 | 1.4 | 10:0 |
| Invention sample 9 | 300 | 1.0 | 9:1 |
| Invention sample 10 | 500 | 1.8 | 10:0 |
| Invention sample 11 | 500 | 1.6 | 9:1 |
| Invention sample 12 | 500 | 1.6 | 10:0 |
| Invention sample 13 | 450 | 1.4 | 9:1 |
| Invention sample 14 | 500 | 1.2 | 1:9 |
| Invention sample 15 | 400 | 1.0 | 10:0 |
| Invention sample 16 | 250 | 0.8 | 10:0 |
| Invention sample 17 | 300 | 2.0 | 9:1 |
| Invention sample 18 | 300 | 1.2 | 10:0 |
| Invention sample 19 | 300 | 1.4 | 10:0 |
| Invention sample 20 | 500 | 1.8 | 1:9 |

TABLE 3

| Sample No. | First laminate structure A1 layer Average thickness (nm) | First laminate structure B1 layer Average thickness (nm) | Second laminate structure A2 layer Average thickness (nm) | Second laminate structure B2 layer Average thickness (nm) |
|---|---|---|---|---|
| Invention sample 1 | 5 | 5 | 50 | 50 |
| Invention sample 2 | 20 | 20 | 100 | 100 |
| Invention sample 3 | 5 | 20 | 200 | 200 |
| Invention sample 4 | 2 | 8 | 500 | 500 |
| Invention sample 5 | 2 | 2 | 50 | 50 |
| Invention sample 6 | 30 | 30 | 100 | 100 |
| Invention sample 7 | 100 | 100 | 50 | 150 |
| Invention sample 8 | 300 | 300 | 100 | 300 |
| Invention sample 9 | 50 | 50 | 200 | 50 |
| Invention sample 10 | 10 | 10 | 100 | 100 |
| Invention sample 11 | 10 | 10 | 400 | 200 |
| Invention sample 12 | 10 | 10 | 150 | 80 |

TABLE 3-continued

|  | First laminate structure | | Second laminate structure | |
|---|---|---|---|---|
| Sample No. | A1 layer Average thickness (nm) | B1 layer Average thickness (nm) | A2 layer Average thickness (nm) | B2 layer Average thickness (nm) |
| Invention sample 13 | 50 | 50 | 100 | 100 |
| Invention sample 14 | 50 | 50 | 100 | 100 |
| Invention sample 15 | 100 | 100 | 100 | 100 |
| Invention sample 16 | 150 | 150 | 100 | 150 |
| Invention sample 17 | 200 | 200 | 300 | 150 |
| Invention sample 18 | 100 | 100 | 100 | 200 |
| Invention sample 19 | 200 | 200 | 500 | 500 |
| Invention sample 20 | 50 | 50 | 100 | 100 |

TABLE 4

| | Coating layer | | | | | | | |
|---|---|---|---|---|---|---|---|---|
| | First layer A1 layer and B1 layer | | | Second layer A2 layer and B2 layer | | | Third layer A1 layer and B1 layer | | |
| Sample No. | Laminate structure | Number of repeats (times) | Average thickness (μm) | Laminate structure | Number of repeats (times) | Average thickness (μm) | Laminate structure | Number of repeats (times) | Average thickness (μm) |
| Invention sample 1 | First | 100 | 1.0 | Second | 20 | 2.0 | First | 100 | 1.0 |
| Invention sample 2 | First | 30 | 1.2 | Second | 10 | 2.0 | — | — | — |
| Invention sample 3 | First | 40 | 1.0 | Second | 8 | 3.2 | First | 40 | 1.0 |
| Invention sample 4 | First | 10 | 0.1 | Second | 4 | 4.0 | First | 50 | 0.5 |
| Invention sample 5 | First | 300 | 1.2 | Second | 10 | 1.0 | First | 600 | 2.4 |
| Invention sample 6 | First | 20 | 1.2 | Second | 15 | 3.0 | First | 20 | 1.2 |
| Invention sample 7 | First | 5 | 1.0 | Second | 15 | 3.0 | — | — | — |
| Invention sample 8 | First | 3 | 1.8 | Second | 5 | 2.0 | — | — | — |
| Invention sample 9 | First | 10 | 1.0 | Second | 12 | 3.0 | — | — | — |
| Invention sample 10 | First | 50 | 1.0 | Second | 10 | 2.0 | First | 50 | 1.0 |
| Invention sample 11 | First | 50 | 1.0 | Second | 10 | 6.0 | First | 50 | 1.0 |
| Invention sample 12 | First | 50 | 1.0 | Second | 30 | 6.9 | — | — | — |
| Invention sample 13 | First | 10 | 1.0 | Second | 15 | 3.0 | — | — | — |
| Invention sample 14 | First | 10 | 1.0 | Second | 20 | 4.0 | — | — | — |
| Invention sample 15 | First | 5 | 1.0 | Second | 15 | 3.0 | — | — | — |
| Invention sample 16 | First | 4 | 1.2 | Second | 16 | 4.0 | First | 4 | 1.2 |
| Invention sample 17 | First | 3 | 1.2 | Second | 4 | 1.8 | First | 3 | 1.2 |
| Invention sample 18 | First | 55 | 11.0 | Second | 4 | 1.2 | — | — | — |
| Invention sample 19 | First | 3 | 1.2 | Second | 11 | 11.0 | — | — | — |

TABLE 4-continued

| | | | | | | | | | |
|---|---|---|---|---|---|---|---|---|---|
| Invention sample 20 | First | 20 | 2.0 | Second | 10 | 2.0 | First | 10 | 1.0 |

| | Coating layer | | | |
|---|---|---|---|---|
| | | Fourth layer A2 layer and B2 layer | | Thickness |
| Sample No. | Laminate structure | Number of repeats (times) | Average thickness (μm) | of entire coating layer (μm) |
| Invention sample 1 | Second | 20 | 2.0 | 6.0 |
| Invention sample 2 | — | — | — | 3.2 |
| Invention sample 3 | Second | 10 | 4.0 | 9.2 |
| Invention sample 4 | — | — | — | 4.6 |
| Invention sample 5 | Second | 10 | 1.0 | 5.6 |
| Invention sample 6 | — | — | — | 5.4 |
| Invention sample 7 | — | — | — | 4.0 |
| Invention sample 8 | — | — | — | 3.8 |
| Invention sample 9 | — | — | — | 4.0 |
| Invention sample 10 | Second | 10 | 2.0 | 6.0 |
| Invention sample 11 | Second | 10 | 6.0 | 14.0 |
| Invention sample 12 | — | — | — | 7.9 |
| Invention sample 13 | — | — | — | 4.0 |
| Invention sample 14 | — | — | — | 5.0 |
| Invention sample 15 | — | — | — | 4.0 |
| Invention sample 16 | Second | 16 | 4.0 | 10.4 |
| Invention sample 17 | — | — | — | 4.2 |
| Invention sample 18 | — | — | — | 12.2 |
| Invention sample 19 | — | — | — | 12.2 |
| Invention sample 20 | Second | 10 | 2.0 | 7.0 |

*The symbol "—" in each of the "third layer" and "fourth layer" columns indicates that the third layer or fourth layer includes neither a first laminate structure nor a second laminate structure.

A machined cemented carbide insert with a shape of RPMT1204EN and a composition of 91.5WC-8.5Co (mass %) was prepared as a substrate. In a reactor of an arc ion plating apparatus, a metal evaporation source was arranged so as to achieve the composition of each layer shown in each of Tables 5 and 6. The prepared substrate was fixed to a fixation fitting of a rotating table in the reactor.

Thereafter, the reactor was evacuated until the pressure therein became $5.0 \times 10^{-3}$ Pa or lower. After the evacuation, the substrate was heated, by a heater in the reactor, until the temperature reached 600° C. After the heating, an Ar gas was introduced into the reactor such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reactor, an ion bombardment process was carried out, with the Ar gas, on a surface of the substrate for 30 minutes. After the ion bombardment process, the reactor was evacuated until the pressure therein became 5.0×10⁻³ Pa or lower.

After the evacuation, as to comparative samples 1, 2 and 3, the substrate was heated until the temperature reached the temperature in Table 7 (temperature when the step was started), a nitrogen (N$_2$) gas was introduced into the reactor, and the pressure in the reactor was adjusted so as to be the pressure shown in Table 7.

As to comparative samples 1 and 2, a bias voltage of −50 V was applied to the substrate, and the metal evaporation source was evaporated via an arc discharge with an arc current of 120 A, whereby the single compound layer shown in Table 5 was formed.

As to comparative sample 3, the X layers and Y layers shown in Table 5 were formed in an alternating manner so as to obtain an alternating laminate. In further detail, a bias voltage of −50 V was applied to the substrate, and the X layers and the Y layers were formed in an alternating manner by simultaneously evaporating a metal evaporation source for the X layers and a metal evaporation source for the Y layers via an arc discharge with an arc current of 120 A. At this time, the thickness of the X layer and the thickness of the Y layer were controlled by adjusting the number of revolutions of the rotating table within a range of from 1 rpm or more to 5 rpm or less so as to achieve the thicknesses shown in Table 5.

Meanwhile, as to comparative samples 4 to 10, the A1 layers and B1 layers shown in Table 6 were formed in an alternating manner so as to obtain a laminate structure (1). In further detail, the substrate temperature was adjusted so as to be the temperature shown in Table 8, an N$_2$ gas was introduced into the reactor, and the pressure in the reactor was adjusted so as to be 3.0 Pa. A bias voltage of −80 V was applied to the substrate, and the A1 layers and the B1 layers were formed in an alternating manner by simultaneously evaporating a metal evaporation source for the A1 layers and a metal evaporation source for the B1 layers via an arc discharge with an arc current of 120 A. At this time, the thickness of the A1 layer and the thickness of the B1 layer were controlled by adjusting the number of revolutions of the rotating table within a range of from 1 rpm or more to 5 rpm or less so as to achieve the thicknesses shown in Table 9. It should be noted that the "absolute value of a composition difference" in Table 6 refers to the "absolute value of a composition difference" between the A1 layer and the B1 layer.

After the formation of the laminate structure (1), the substrate temperature was adjusted so as to be 550° C. (temperature when the step was started). As to the A2 layer, an oxygen (O$_2$) gas and a nitrogen (N$_2$) gas were introduced into the reactor at the ratio shown in Table 8, and the pressure in the reactor was adjusted so as to be the pressure shown in Table 8. Further, as to the B2 layer, an oxygen (O$_2$) gas and a nitrogen (N$_2$) gas were introduced into the reactor at the ratio shown in Table 8, and the pressure in the reactor was adjusted so as to be the pressure shown in Table 8.

Then, as to comparative samples 4 to 10, the A2 layers and B2 layers shown in Table 6 were formed in an alternating manner so as to obtain a laminate structure (2). In further detail, a bias voltage of −60 V was applied to the substrate, and the A2 layers and the B2 layers were formed in an alternating manner by simultaneously evaporating a metal evaporation source for the A2 layers and a metal evaporation source for the B2 layers via an arc discharge with an arc current of 120 A. At this time, the thickness of the A2 layer and the thickness of the B2 layer were controlled by adjusting the number of revolutions of the rotating table within a range of from 1 rpm or more to 5 rpm or less so as to achieve the thicknesses shown in Table 9.

After the formation of each layer with the predetermined average thickness shown in each of Tables 5, 9 and 10 on the substrate surface, the heater was turned off, and the sample was taken out of the reactor after the temperature of the sample reached 100° C. or lower. Comparative samples 1 to 10 were made through the above-described method.

TABLE 5

| | | Coating layer | | | | |
|---|---|---|---|---|---|---|
| Sample No. | X layer Composition | Y layer Composition | X layer Average thickness (nm) | Y layer Average thickness (nm) | X layer and Y layer Number of repeats (times) | Average thickness of entire coating layer (μm) |
| Comparative sample 1 | $(Al_{0.60}Ti_{0.40})N$ | — | 5,000 | — | 1 | 5.0 |
| Comparative sample 2 | $(Al_{0.60}Cr_{0.40})N$ | — | 3,500 | — | 1 | 3.5 |
| Comparative sample 3 | $(Al_{0.70}Ti_{0.30})N$ | TiN | 50 | 50 | 40 | 4.0 |

* The symbol "—" in the "Y layer" column indicates that the coating layer includes no Y layers.

TABLE 6

| | Laminate structure (1) | | | Laminate structure (2) | |
|---|---|---|---|---|---|
| Sample No. | A1 layer Composition | B1 layer Composition | Absolute value of composition difference (atm %) | A2 layer Composition | B2 layer Composition |
| Comparative sample 4 | $(Al_{0.75}Ti_{0.25})N$ | TiN | 75 | $(Al_{0.70}Cr_{0.30})_2O_3$ | $(Al_{0.70}Cr_{0.30})N$ |

TABLE 6-continued

| | Laminate structure (1) | | | Laminate structure (2) | |
|---|---|---|---|---|---|
| Sample No. | A1 layer Composition | B1 layer Composition | Absolute value of composition difference (atm %) | A2 layer Composition | B2 layer Composition |
| Comparative sample 5 | $(Al_{0.70}Cr_{0.30})N$ | $(Al_{0.50}Cr_{0.50})N$ | 20 | $(Al_{0.50}Cr_{0.50})_2O_3$ | $(Al_{0.70}Ti_{0.30})N$ |
| Comparative sample 6 | $(Al_{0.50}Ti_{0.40}Si_{0.10})N$ | $(Al_{0.45}Ti_{0.40}Si_{0.15})N$ | 5 | $(Al_{0.70}Cr_{0.30})_2O_3$ | $(Al_{0.45}Cr_{0.55})(N_{0.95}O_{0.05})$ |
| Comparative sample 7 | $(Al_{0.50}Ti_{0.50})N$ | $(Al_{0.45}Ti_{0.55})N$ | 5 | $(Al_{0.70}Cr_{0.30})N$ | AlN |
| Comparative sample 8 | $(Al_{0.70}Ti_{0.20}W_{0.10})N$ | $(Al_{0.70}Ti_{0.22}W_{0.08})N$ | 2 | $(Al_{0.50}Cr_{0.50})_2O_3$ | $(Al_{0.70}Ti_{0.30})N$ |
| Comparative sample 9 | $(Al_{0.75}Ti_{0.25})N$ | $(Al_{0.72}Ti_{0.28})N$ | 3 | $Al_2O_3$ | $(Al_{0.70}Cr_{0.30})_2O_3$ |
| Comparative sample 10 | $(Ti_{0.85}Si_{0.15})N$ | $(Ti_{0.90}Si_{0.10})N$ | 5 | $(Al_{0.50}Ti_{0.50})N$ | TiN |

TABLE 7

| | Single layer or alternating laminate | |
|---|---|---|
| Sample No. | Temperature (° C.) | Pressure (Pa) |
| Comparative sample 1 | 250 | 4.0 |
| Comparative sample 2 | 350 | 4.0 |
| Comparative sample 3 | 400 | 2.0 |

TABLE 8

| | Laminate structure (1) | Laminate structure (2) | | | |
|---|---|---|---|---|---|
| | | A2 layer | | B2 layer | |
| Sample No. | Temperature (° C.) | Pressure (Pa) | ($O_2$:$N_2$) | Pressure (Pa) | ($O_2$:$N_2$) |
| Comparative sample 4 | 350 | 1.6 | 10:0 | 1.6 | 0:10 |
| Comparative sample 5 | 450 | 1.6 | 10:0 | 1.6 | 0:10 |
| Comparative sample 6 | 400 | 1.6 | 10:0 | 1.6 | 1:9 |
| Comparative sample 7 | 550 | 1.6 | 0:10 | 1.6 | 0:10 |
| Comparative sample 8 | 450 | 1.6 | 10:0 | 1.6 | 0:10 |
| Comparative sample 9 | 450 | 1.0 | 10:0 | 1.0 | 10:0 |
| Comparative sample 10 | 350 | 2.0 | 0:10 | 2.0 | 0:10 |

TABLE 9

| | Laminate structure (1) | | Laminate structure (2) | |
|---|---|---|---|---|
| Sample No. | A1 layer Average thickness (nm) | B1 layer Average thickness (nm) | A2 layer Average thickness (nm) | B2 layer Average thickness (nm) |
| Comparative sample 4 | 100 | 100 | 100 | 100 |
| Comparative sample 5 | 20 | 20 | 200 | 200 |
| Comparative sample 6 | 100 | 100 | 200 | 200 |
| Comparative sample 7 | 80 | 80 | 80 | 80 |
| Comparative sample 8 | 500 | 500 | 500 | 500 |
| Comparative sample 9 | 50 | 50 | 300 | 300 |
| Comparative sample 10 | 300 | 200 | 200 | 300 |

TABLE 10

| | Coating layer | | | | | | | | |
|---|---|---|---|---|---|---|---|---|---|
| | First layer A1 layer and B1 layer | | | Second layer A2 layer and B2 layer | | | Third layer A1 layer and B1 layer | | |
| Sample No. | Laminate structure | Number of repeats (times) | Average thickness (μm) | Laminate structure | Number of repeats (times) | Average thickness (μm) | Laminate structure | Number of repeats (times) | Average thickness (μm) |
| Comparative sample 4 | (1) | 10 | 2.0 | (2) | 10 | 2.0 | — | — | — |

TABLE 10-continued

| | | | | | | | | | |
|---|---|---|---|---|---|---|---|---|---|
| Comparative sample 5 | (1) | 10 | 0.4 | (2) | 5 | 2.0 | (1) | 10 | 0.4 |
| Comparative sample 6 | (1) | 5 | 1.0 | (2) | 3 | 1.2 | (1) | 10 | 2.0 |
| Comparative sample 7 | (1) | 5 | 0.8 | (2) | 25 | 4.0 | — | — | — |
| Comparative sample 8 | (1) | 4 | 4.0 | (2) | 4 | 4.0 | (1) | 4 | 4.0 |
| Comparative sample 9 | (1) | 10 | 1.0 | (2) | 4 | 2.4 | (1) | 10 | 1.0 |
| Comparative sample 10 | (1) | 4 | 2.0 | (2) | 4 | 2.0 | — | — | — |

| | Coating layer | | | |
|---|---|---|---|---|
| | Fourth layer A2 layer and B2 layer | | | |
| Sample No. | Laminate structure | Number of repeats (times) | Average thickness (μm) | Thickness of entire coating layer (μm) |
| Comparative sample 4 | — | — | — | 4.0 |
| Comparative sample 5 | (2) | 5 | 2.0 | 4.8 |
| Comparative sample 6 | (2) | 3 | 1.2 | 5.4 |
| Comparative sample 7 | — | — | — | 4.8 |
| Comparative sample 8 | (2) | 4 | 4.0 | 16.0 |
| Comparative sample 9 | — | — | — | 4.4 |
| Comparative sample 10 | — | — | — | 4.0 |

* The symbol "—" in each of the "third layer" and "fourth layer" columns indicates that the third layer or fourth layer includes neither a laminate structure (1) nor a laminate structure (2).

As to the average thickness of each layer of each of the obtained samples, such average thickness was obtained by: measuring the thickness of each layer via a TEM observation of each of the cross-sectional surfaces at three locations near the position 50 μm from the edge of a surface facing the metal evaporation source of the coated cutting tool, toward the center of such surface; and calculating the arithmetic mean of the resulting measurements. The composition of each layer of the obtained sample was measured from the cross-sectional surface near the position at most 50 μm from the edge of a surface facing the metal evaporation source of the coated cutting tool, toward the center of such surface, using an EDS. The measurement results are shown in Tables 1, 3 to 6, 9 and 10. It should be noted that the composition ratio of the metal elements of each layer in each of Tables 1, 5 and 6 refers to an atomic ratio of each metal element relative to all the metal elements in the compound which constitutes each layer.

The average grain size of the first laminate structure of the obtained sample was obtained as set forth below. Firstly, a cross-sectional structure of the coated cutting tool was observed with the TEM, and an image magnified 60,000 times was taken. A line (with a width equal to 200 nm) parallel with the substrate surface was drawn on the taken image so as to traverse the structure of the first laminate structure. The value obtained by dividing the length (diameter) of the particles included in the line by the number of particles contained on the line was regarded as a grain size of the first laminate structure. Five lines were drawn, and, as to such respective lines, grain sizes of the first laminate structure were measured. The arithmetic mean of the obtained grain sizes of the first laminate structure was calculated, and the resulting value was defined as an average grain size of the first laminate structure. The average grain size of the second laminate structure was obtained through the same method. The results are shown in Table 11. As to the comparative samples, the average grain size of each of the single layer, the alternating laminate, the laminate structure (1) and the laminate structure (2) was obtained through the same method. The results are shown in Tables 12 and 13.

TABLE 11

| Sample No. | First laminate structure Average grain size (nm) | Second laminate structure Average grain size (nm) |
|---|---|---|
| Invention sample 1 | 120 | 100 |
| Invention sample 2 | 80 | 60 |
| Invention sample 3 | 50 | 10 |
| Invention sample 4 | 30 | 40 |
| Invention sample 5 | 120 | 130 |
| Invention sample 6 | 240 | 250 |
| Invention sample 7 | 100 | 150 |
| Invention sample 8 | 220 | 150 |
| Invention sample 9 | 150 | 280 |
| Invention sample 10 | 60 | 60 |

TABLE 11-continued

| Sample No. | First laminate structure Average grain size (nm) | Second laminate structure Average grain size (nm) |
|---|---|---|
| Invention sample 11 | 60 | 80 |
| Invention sample 12 | 60 | 100 |
| Invention sample 13 | 80 | 150 |
| Invention sample 14 | 80 | 200 |
| Invention sample 15 | 80 | 250 |
| Invention sample 16 | 320 | 350 |
| Invention sample 17 | 150 | 15 |
| Invention sample 18 | 250 | 200 |
| Invention sample 19 | 250 | 130 |
| Invention sample 20 | 15 | 50 |

TABLE 12

| Sample No. | Single layer or alternating laminate Average grain size (nm) |
|---|---|
| Comparative sample 1 | 360 |
| Comparative sample 2 | 300 |
| Comparative sample 3 | 130 |

TABLE 13

| Sample No. | Laminate structure (1) Average grain size (nm) | Laminate structure (2) Average grain size (nm) |
|---|---|---|
| Comparative sample 4 | 230 | 120 |
| Comparative sample 5 | 150 | 80 |
| Comparative sample 6 | 100 | 100 |
| Comparative sample 7 | 80 | 120 |
| Comparative sample 8 | 90 | 90 |
| Comparative sample 9 | 60 | 200 |
| Comparative sample 10 | 30 | 450 |

Using the obtained samples, the following cutting test was conducted for performing evaluations.

[Cutting Test]
Workpiece: SUS410
Workpiece shape: Parallelepiped block of 100 mm×200 mm×60 mm
Cutting speed: 330 m/min
Feed per tooth: 0.40 mm/t
Cutting width: 32.5 mm
Cutting depth: 2.0 mm
Coolant: Not used
Evaluation items: A time when a sample was fractured (chipping occurred in the cutting edge of a sample) or when a flank wear had a width of 0.5 mm was defined as the end of the tool life, and the machining length to reach the end of the tool life was measured.

The results of the cutting test are shown in Tables 14 and 15.

TABLE 14

| Sample No. | Cutting test Machining length (m) |
|---|---|
| Invention sample 1 | 18.9 |
| Invention sample 2 | 16.7 |
| Invention sample 3 | 14.0 |
| Invention sample 4 | 11.9 |
| Invention sample 5 | 17.3 |
| Invention sample 6 | 18.4 |
| Invention sample 7 | 17.8 |
| Invention sample 8 | 15.7 |
| Invention sample 9 | 17.8 |
| Invention sample 10 | 18.9 |
| Invention sample 11 | 13.5 |
| Invention sample 12 | 16.2 |
| Invention sample 13 | 17.8 |
| Invention sample 14 | 18.4 |
| Invention sample 15 | 15.1 |
| Invention sample 16 | 14.6 |
| Invention sample 17 | 13.0 |
| Invention sample 18 | 12.4 |
| Invention sample 19 | 12.4 |
| Invention sample 20 | 15.1 |

TABLE 15

| Sample No. | Cutting test Machining length (m) |
|---|---|
| Comparative sample 1 | 5.9 |
| Comparative sample 2 | 5.4 |
| Comparative sample 3 | 7.0 |
| Comparative sample 4 | 7.6 |
| Comparative sample 5 | 8.1 |
| Comparative sample 6 | 9.7 |
| Comparative sample 7 | 9.2 |

TABLE 15-continued

| Sample No. | Cutting test Machining length (m) |
|---|---|
| Comparative sample 8 | 7.0 |
| Comparative sample 9 | 10.3 |
| Comparative sample 10 | 8.6 |

The results of Tables 14 and 15 indicate that the machining length of each invention sample is longer than the machining length of each comparative sample. Therefore, it is apparent that the invention samples each involve a longer tool life. The factors for the above can be considered to derive from the invention samples being excellent in terms of oxidation resistance, wear resistance and fracture resistance, but the factors are not limited thereto.

Example 2

A machined cemented carbide insert with a shape of RPMT1204EN and a composition of 91.5WC-8.5Co (mass %) was prepared as a substrate. A sample including the coating layer of each of invention samples 1 to 10 in Example 1 and also including a lower layer for such coating layer and an upper layer therefor was made.

Firstly, in a reactor of an arc ion plating apparatus, a metal evaporation source was arranged so as to achieve the composition of each layer of each of invention samples 1 to 10 shown in Table 1 and each of invention samples 30 to 39 shown in Table 16. The prepared substrate was fixed to a fixation fitting of a rotating table in the reactor.

Thereafter, the reactor was evacuated until the pressure therein became $5.0 \times 10^{-3}$ Pa or lower. After the evacuation, the substrate was heated, by a heater in the reactor, until the temperature reached 600° C. After the heating, an Ar gas was introduced into the reactor such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reactor, an ion bombardment process was carried out, with the Ar gas, on a surface of the substrate for 30 minutes. After the ion bombardment process, the reactor was evacuated until the pressure therein became $5.0 \times 10^{-3}$ Pa or lower.

After the evacuation, the temperature in the reactor was controlled so as to be 500° C., a nitrogen ($N_2$) gas was introduced into the reactor, and the pressure in the reactor was adjusted so as to be 4.0 Pa.

Then, the lower layer was formed, as shown in Table 16. In further detail, a bias voltage of −50 V was applied to the substrate, and the metal evaporation source was evaporated via an arc discharge with an arc current of 120 A, whereby the lower layer was formed.

After the formation of the lower layer, a first laminate structure and a second laminate structure were formed under the same conditions as those for invention samples 1 to 10 in Example 1.

After the formation of the first laminate structure and the second laminate structure, a bias voltage of −50 V was applied to the substrate, and the metal evaporation source was evaporated via an arc discharge with an arc current of 120 A, whereby the upper layer shown in Table 16 was formed. At this time, the temperature in the reactor was controlled so as to be 500° C. Invention samples 21 to 30 were made through the above-described method.

TABLE 16

| | Coating layer | | | | | Thickness of entire coating layer (μm) |
|---|---|---|---|---|---|---|
| | Lower layer | | | Upper layer | | |
| Sample No. | Composition | Average thickness (μm) | First laminate structure and second laminate structure | Composition | Average thickness (μm) | |
| Invention sample 21 | $(Ti_{0.40}Al_{0.60})N$ | 0.5 | Invention sample 1 | $(Ti_{0.85}Si_{0.15})N$ | 1.0 | 7.5 |
| Invention sample 22 | $(Ti_{0.60}Al_{0.40})N$ | 2.0 | Invention sample 2 | $(Ti_{0.90}Si_{0.10})N$ | 1.0 | 6.2 |
| Invention sample 23 | $(Cr_{0.30}Al_{0.70})N$ | 1.0 | Invention sample 3 | TiN | 0.5 | 10.7 |
| Invention sample 24 | $(Cr_{0.50}Al_{0.50})N$ | 2.5 | Invention sample 4 | TiN | 0.3 | 7.4 |
| Invention sample 25 | $(Ti_{0.50}Al_{0.40}Nb_{0.05}W_{0.05})N$ | 0.5 | Invention sample 5 | $(Ti_{0.40}Al_{0.60})N$ | 2.0 | 8.1 |
| Invention sample 26 | $(Ti_{0.40}Al_{0.40}Nb_{0.10}W_{0.10})N$ | 1.0 | Invention sample 6 | $(Ti_{0.60}Al_{0.40})N$ | 0.5 | 6.9 |
| Invention sample 27 | $(Ti_{0.30}Al_{0.30}Cr_{0.30}Si_{0.10})N$ | 0.3 | Invention sample 7 | $(Ti_{0.50}Al_{0.40}Nb_{0.05}W_{0.05})N$ | 1.0 | 5.3 |
| Invention sample 28 | $(Ti_{0.40}Al_{0.30}Cr_{0.15}Sr_{0.15})N$ | 3.0 | Invention sample 8 | $(Ti_{0.40}Al_{0.40}Nb_{0.10}W_{0.10})N$ | 0.5 | 7.3 |
| Invention sample 29 | TiN | 1.0 | Invention sample 9 | $(Cr_{0.30}Al_{0.70})N$ | 2.0 | 7.0 |
| Invention sample 30 | TiN | 0.5 | Invention sample 10 | $(Cr_{0.50}Al_{0.50})N$ | 1.5 | 8.0 |

The average thickness of each layer and the composition of each layer in the obtained sample were obtained through the same method as in Example 1. The results are shown in Tables 1 and 16.

The average grain size of each of the first laminate structure and the second laminate structure in the obtained sample was obtained through the same method as in Example 1. The results were the same as those regarding invention samples 1 to 10 which are shown in Table 11.

Using invention samples 21 to 30, a cutting test was conducted, as shown in Example 1. The results of the cutting test are shown in Table 17.

TABLE 17

| Sample No. | Cutting test Machining length (m) |
|---|---|
| Invention sample 21 | 20.1 |
| Invention sample 22 | 18.9 |
| Invention sample 23 | 14.8 |
| Invention sample 24 | 14.2 |
| Invention sample 25 | 19.3 |
| Invention sample 26 | 19.1 |
| Invention sample 27 | 18.4 |
| Invention sample 28 | 18.0 |
| Invention sample 29 | 19.8 |
| Invention sample 30 | 19.9 |

The results of Table 17 indicate that the machining length of each of invention samples 21 to 30 is slightly longer than the machining length of each of invention samples 1 to 10. Therefore, it is apparent that the invention samples each provide the effect of the present invention even if they each include the upper layer and the lower layer.

The present application is based on the Japanese patent application filed on Mar. 28, 2017 (JP Appl. 2017-062038), the content of which is incorporated herein by reference.

INDUSTRIAL APPLICABILITY

As to a coated cutting tool according to the present invention, since such coated cutting tool has excellent oxidation resistance, wear resistance and fracture resistance and since the tool life can be extended more than that involved in the prior art, the coated cutting tool has high industrial applicability.

REFERENCE SIGNS LIST

1 Substrate
2 Lower layer
3 A1 layer
4 B1 layer
5 A2 layer
6 B2 layer
7 Upper layer
8 First laminate structure
9 Second laminate structure
10 Coating layer
11 Coated cutting tool

What is claimed is:

1. A coated cutting tool comprising a substrate and a coating layer formed on a surface of the substrate,
the coating layer comprising a first laminate structure and a second laminate structure, wherein:
the first laminate structure has a laminate structure in which compound layers of two kinds, each having a different composition, are laminated in an alternating manner;
one compound layer of the compound layers of two kinds in the first laminate structure has a composition represented by formula (1) below:

$$(Al_a M_{1-a})N \quad (1)$$

M denotes an element of at least one kind selected from the group consisting of Ti, Zr, Hf, V, Nb, Ta, Cr, Mo, W and Si, a denotes an atomic ratio of the Al element based on a total of the Al element and a metal element denoted by M, and a satisfies $0.58 \leq a \leq 0.80$;
the other compound layer of the compound layers of two kinds in the first laminate structure has a composition represented by formula (2) below:

$$(Al_b M_{1-b})N \quad (2)$$

wherein M denotes an element of at least one kind selected from the group consisting of Ti, Zr, Hf, V, Nb, Ta, Cr, Mo, W and Si, b denotes an atomic ratio of the Al element based on a total of the Al element and a metal element denoted by M, and b satisfies $0.57 \leq b \leq 0.79$;
wherein M in formula (1) and M in formula (2) are the same element;
the first laminate structure satisfies a condition represented by formula (A) below:

$$0 < |Rx - Ry1| < 5 \quad (A)$$

wherein Rx denotes a ratio (unit:atom %) of a metal element of one kind relative to all the metal elements in the one compound layer, and Ry denotes a ratio (unit:atom %) of the metal element of one kind relative to all the metal elements in the other compound layer which is adjacent to the one compound layer, and the metal element of one kind denotes an element having the largest absolute value of a difference between a ratio relative to all the metal elements in the one compound layer and a ratio relative to all the metal elements in the other compound layer;
the second laminate structure has a laminate structure in which a first compound layer and a second compound layer are laminated in an alternating manner;
the first compound layer comprises at least one kind selected from the group consisting of an oxide and an oxynitride of an element having a composition represented by formula (3) below:

$$(Al_{1-c} Cr_c) \quad (3)$$

wherein c denotes an atomic ratio of the Cr element based on a total of the Al element and the Cr element, and c satisfies $0 \leq c \leq 0.60$;
the second compound layer has a composition represented by formula (4) below:

$$(Al_{1-d} L_d)N \quad (4)$$

wherein L denotes an element of at least one kind selected from the group consisting of Ti, Zr, Hf, V, Nb, Ta, Cr, Mo, W and Si, d denotes an atomic ratio of an element denoted by L based on a total of the Al element and the metal element denoted by L, and d satisfies $0 \leq d \leq 0.55$;
an average thickness of each of the one compound layer and the other compound layer which constitute the first laminate structure is from 1 nm or more to 300 nm or less;
an average thickness of each of the first compound layer and the second compound layer which constitute the second laminate structure is from 50 nm or more to 500 nm or less; and
a thickness of the coating layer in its entirety is from 1.5 µm or more to 15.0 µm or less.

2. The coated cutting tool according to claim 1, wherein the 1 Rx−Ry1 is from 1 atom % or higher to 4 atom % or lower.

3. The coated cutting tool according to claim 1, wherein the first compound layer has a composition represented by formula (5) or (6) below:

$$(Al_{1-c}Cr_c)_2O_3 \quad (5)$$

$$(Al_{1-c}Cr_c)(N_{1-e}O_e) \quad (6)$$

wherein c denotes an atomic ratio of the Cr element based on a total of the Al element and the Cr element, e denotes an atomic ratio of the O element based on a total of the N element and the O element, and c and e respectively satisfy $0 \leq c \leq 0.60$ and $0 < e \leq 1$.

4. The coated cutting tool according to claim 1, wherein the coating layer comprises a structure in which two or more laminate structures, each of which is either the first laminate structure or the second laminate structure, are laminated in an alternating manner.

5. The coated cutting tool according to claim 1, wherein an average thickness of the first laminate structure is from 0.1 μm or more to 10.0 μm or less.

6. The coated cutting tool according to claim 1, wherein an average thickness of the second laminate structure is from 0.2 μm or more to 10.0 μm or less.

7. The coated cutting tool according to claim 1, wherein an average grain size of the first laminate structure is from 10 nm or more to 450 nm or less.

8. The coated cutting tool according to claim 1, wherein an average grain size of the second laminate structure is from 5 nm or more to 300 nm or less.

9. The coated cutting tool according to claim 1, wherein:
the coating layer includes a lower layer located so as to be closer to the substrate than the first laminate structure and the second laminate structure;
the lower layer is a compound layer of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 μm or more to 3.5 μm or less.

10. The coated cutting tool according to claim 1, wherein:
the coating layer includes an upper layer on a side of the first laminate structure and the second laminate structure which is opposite to the substrate;
the upper layer is a compound layer of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 μm or more to 3.5 μm or less.

11. The coated cutting tool according to claim 1, wherein the substrate is a cemented carbide, cermet, ceramics or a cubic boron nitride sintered body.

12. The coated cutting tool according to claim 2, wherein the first compound layer has a composition represented by formula (5) or (6) below:

$$(Al_{1-c}Cr_c)_2O_3 \quad (5)$$

$$(Al_{1-c}Cr_c)(N_{1-e}O_e) \quad (6)$$

wherein c denotes an atomic ratio of the Cr element based on a total of the Al element and the Cr element, e denotes an atomic ratio of the O element based on a total of the N element and the O element, and c and e respectively satisfy $0 \leq c \leq 0.60$ and $0 < e \leq 1$.

13. The coated cutting tool according to claim 2, wherein the coating layer comprises a structure in which two or more laminate structures, each of which is either the first laminate structure or the second laminate structure, are laminated in an alternating manner.

14. The coated cutting tool according to claim 3, wherein the coating layer comprises a structure in which two or more laminate structures, each of which is either the first laminate structure or the second laminate structure, are laminated in an alternating manner.

15. The coated cutting tool according to claim 2, wherein an average thickness of the first laminate structure is from 0.1 μm or more to 10.0 μm or less.

16. The coated cutting tool according to claim 3, wherein an average thickness of the first laminate structure is from 0.1 μm or more to 10.0 μm or less.

17. The coated cutting tool according to claim 4, wherein an average thickness of the first laminate structure is from 0.1 μm or more to 10.0 μm or less.

18. The coated cutting tool according to claim 2, wherein an average thickness of the second laminate structure is from 0.2 μm or more to 10.0 μm or less.

19. The coated cutting tool according to claim 3, wherein an average thickness of the second laminate structure is from 0.2 μm or more to 10.0 μm or less.

20. The coated cutting tool according to claim 1, wherein an average thickness of the second laminate structure is from 0.2 μm or more to 10.0 μm or less.

* * * * *